United States Patent
Shaw et al.

(10) Patent No.: US 6,872,581 B2
(45) Date of Patent: Mar. 29, 2005

(54) MEASURING BACK-SIDE VOLTAGE OF AN INTEGRATED CIRCUIT

(75) Inventors: Christopher Shaw, Mountain View, CA (US); Chun-Cheng Tsao, Cupertino, CA (US); Theodore R. Lundquist, Dublin, CA (US)

(73) Assignee: NPTest, Inc., San Jose, CA (US)

( * ) Notice: Subject to any disclaimer, the term of this patent is extended or adjusted under 35 U.S.C. 154(b) by 457 days.

(21) Appl. No.: 10/123,842

(22) Filed: Apr. 15, 2002

(65) Prior Publication Data

US 2002/0151091 A1 Oct. 17, 2002

Related U.S. Application Data

(60) Provisional application No. 60/284,322, filed on Apr. 16, 2001.

(51) Int. Cl.$^7$ ............................................... H01L 21/00
(52) U.S. Cl. ............................................................ 438/6
(58) Field of Search ........................ 438/14, 6; 264/258; 385/16

(56) References Cited

U.S. PATENT DOCUMENTS

| 4,169,244 A | 9/1979 | Plows |
|---|---|---|
| 4,706,019 A | 11/1987 | Richardson |
| 5,548,211 A | 8/1996 | Tujide |
| 5,840,593 A | * 11/1998 | Leedy ............................ 438/6 |
| 5,911,018 A | * 6/1999 | Bischel ......................... 385/16 |
| 5,972,725 A | 10/1999 | Wollesen et al. |
| 5,990,562 A | 11/1999 | Vallett |
| 6,093,331 A | 7/2000 | Wollesen |
| 6,147,399 A | 11/2000 | Li et al. |

OTHER PUBLICATIONS

T.M. Eiles, et al., "Transparent Heat Spreader for Backside Optical Analysis of High Power Microprocessors," Proceedings of the 26$^{th}$ International Symposium for Testing and Failure Analysis (2000), pp. 547–551.

* cited by examiner

*Primary Examiner*—John F. Niebling
*Assistant Examiner*—Andre C Stevenson
(74) *Attorney, Agent, or Firm*—Fish & Richardson P.C.

(57) ABSTRACT

Methods for integrated circuit diagnosis, characterization or modification using a charged particle beam. In one implementation, the bulk silicon substrate of an integrated circuit is thinned to about 1 to 3 μm from the deepest well, a voltage is applied to a circuit element that is beneath the outer surface of the thinned substrate. The applied voltage induces an electrical potential on the outer surface, which is detected as a surface feature on the outer surface by its interaction with the charged particle beam.

25 Claims, 8 Drawing Sheets

MEASURING BACK-SIDE VOLTAGE OF AN INTEGRATED CIRCUIT

CROSS-REFERENCE TO RELATED APPLICATIONS

This application claims the benefit of U.S. Provisional Application No. 60/284,322, filed on Apr. 16, 2001.

BACKGROUND

This invention relates to integrated circuit diagnosis, characterization and modification using charged particle beams.

Electron beam diagnostic systems have been a powerful tool for integrated circuit (IC) characterization and debug applications for many years. The well-known aspects of electron beam diagnostic systems include secondary electron imaging, circuit navigation using a built-in computer automated design (CAD) display, and voltage measurements from active circuits using voltage contrast principles. (See, for example, U.S. Pat. No. 4,706,019.) Electron beam diagnostic systems have traditionally been used on the frontside of an IC. The implementation of face-down or flip-chip IC packaging has created severe limitations for the use of electron beam diagnostic systems. An IC using flip-chip packaging has only the back-side (silicon substrate) of the IC exposed.

Three approaches currently exist for making electron beam measurements on the back-side of a flip-chip device: (1) circuit node access at probe points fabricated into the device (as described, for example, in U.S. Pat. No. 5,990, 562); (2) circuit node access through exposure by focused ion beam after device fabrication (as described, for example, in U.S. Pat. No. 6,147,399); and (3) removing the silicon substrate entirely to enable access to the diffusion by wet chemical etching for back-side voltage measurement (as described, for example, in Yoshida, E., et al., Backside Electron Beam Testing Method, Proceedings of the LSI Testing Conference (1997), and U.S. Pat. No. 5,972,725). These approaches require either complicated device designs, specialized equipment, or time consuming device modifications after manufacturing.

The first approach relies on selecting the nodes to be probed at the device design phase. After device construction, the critical nodes for device debug or characterization are determined by electrical testing or other means. The nodes that are identified for probing may not have the necessary built-in probe points due to oversight during the device design. If a node needs to be probed after manufacturing, and a built-in probe point has not been designed-in, access to the node can be created using a focused ion beam. An alternative is to include probe points for every device node, which is impractical.

The second approach creates access to critical device nodes after manufacturing using a focused ion beam system. Using this method, nodes are identified by device testing or other means, and a focused ion beam system is used to remove the silicon substrate from the device back-side over a local area of the node to be probed. This method, while effective, can result in damage to the device by the focused ion beam system. Furthermore, the focused ion beam system can only expose one device node at a time. Creating access to multiple device nodes is a difficult, potentially damaging, and time-consuming process.

The third approach of removing the silicon substrate by wet chemical etch is only applicable to devices manufactured using silicon-on-insulator (SOI) technology or CMOS devices with an epitaxial layer. The $SiO_2$ layer for an SOI device and the epitaxial layer for a CMOS device are used as barriers to stop the chemical etch reaction. This approach requires the effort and expense of using specialized equipment to deliver the necessary chemical agents. Once the substrate is completely removed, the problem of exactly locating the node of interest to be probed still remains.

SUMMARY

In general, in one aspect, the invention features a method for characterizing and modifying an integrated circuit. The method includes applying a voltage to a circuit element of an integrated circuit that has a thinned substrate layer. The circuit element is beneath an outer surface of the thinned substrate layer, and the applied voltage induces an electrical potential on the outer surface. The electrical potential is detected as a surface feature on the outer surface.

In general, in another aspect, the invention features a method for determining the location of a circuit element in an integrated circuit. The method includes obtaining a voltage contrast image by detecting the electrical potentials over a region of the outer surface. The voltage contrast image is used to determine the location of the circuit element.

In general, in another aspect, the invention features a method for characterizing an integrated circuit. The method includes inducing a current in the circuit element through the thinned substrate with an electron beam from an electron beam prober, and detecting the induced current to perform failure analysis.

One or more of the following features can also be included in particular implementations. The substrate can be a silicon substrate. The thinned substrate layer can be created by thinning the substrate to about 1 to 3 micrometers from the deepest wells. The outer surface of the substrate can be polished. Detecting the electrical potential can include applying a charged particle beam to the outer surface and measuring secondary particles generated by the charged particle beam. The charged particle beam can be an electron beam or a focused ion beam. The circuit element can be an N-well layer, a P diffusion within an N well, a P-well layer, an N diffusion within a P well, or a diffusion region of the integrated circuit. The applied voltage can include a time dependent or a time independent component or both. A heat dissipation element can be placed on the outer surface. The voltage contrast image can be aligned with a CAD layout image.

The invention can be implemented to realize one or more of the following advantages. 1. An IC with substantial metal on the front side can be diagnosed, characterized, or modified from the back side with a charged particle beam. 2. This can be done without damaging the circuit or making it inoperative. 3. A circuit element can be measured without manufacturing a probe point connected to the circuit element. 4. A number of circuit elements can be diagnosed at the same time by means of an imaging approach or a beam multiplexing approach. 5. A charged particle beam can image circuit elements and the image can be used to navigate the circuit and find the circuit element or elements to be probed. 6. The beam can be used to edit the circuit by injecting a charge, for example, a charge to damage a gate oxide on a CMOS transistor. 7. By using the techniques of the invention to map the transistors of an IC, one can facilitate the reverse engineering of the IC. 8. The applications of e-beam probing can be expanded because focused ion beam probe points do not necessarily have to be created. 9. In-circuit measurement and circuit modifications can be performed by the same instrument, for example, a conventional e-beam prober. 10. This will add in-circuit editing capability to e-beam systems, by means of e-beam depositions and enhanced etching. 11. Having found structures of an IC, one can use the e-beam to deliver an electron dose to any node for failure analysis using EBIC (electron beam induced current).

The details of one or more embodiments of the invention are set forth in the accompanying drawings and the description below. Other features and advantages of the invention will be apparent from the description, drawings, and claims.

DESCRIPTION OF DRAWINGS

Like reference symbols in the various drawings indicate like elements.

DETAILED DESCRIPTION

A charged particle beam diagnostic system can be used in accordance with the invention to diagnose, characterize, or modify circuit elements of a flip-chip or other IC by providing access to underlying structures through a thinned silicon substrate. This can be done even on ICs that cannot be accessed as a whole but can be accessed when sufficiently disassembled, and so the invention has application to failure analysis.

Figure 1:
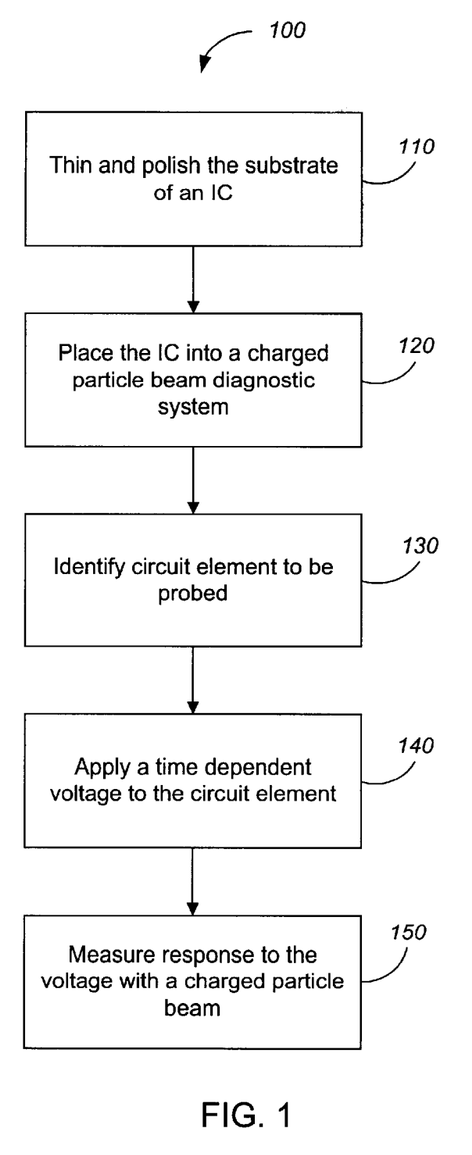
FIG. 1 is a flowchart of a method for measuring a flip-chip IC with an electron beam diagnostic system in an implementation of the invention.

As shown in FIG. 1, one method 100 in accordance with the invention has five major steps. Preliminarily, the substrate of an IC, e.g., a flip-chip IC, is thinned and polished (step 110) as explained in more detail in reference to FIG. 2. The thinned IC is placed in a charged particle beam diagnostic system (step 120) as shown in FIG. 3. Appropriate systems include the Schlumberger IDS 10000da e-beam probe system available from Schlumberger Semiconductor Solutions of San Jose, Calif. Using this system, a circuit element to be probed is identified (step 130); an implementation of this step is described with reference to FIGS. 4–6. A voltage is applied to a circuit element, and the response to the applied voltage is measured (step 150); this is described with reference to FIGS. 7a, 7b, and 8. After the location of a circuit element is determined, the charged particle beam can be used to stimulate the circuit, and the response can be measured either by use of the particle beam (multiplexed for that purpose) or by taking measurements at an access point such as the pins or contacts of the IC.

Figure 2:
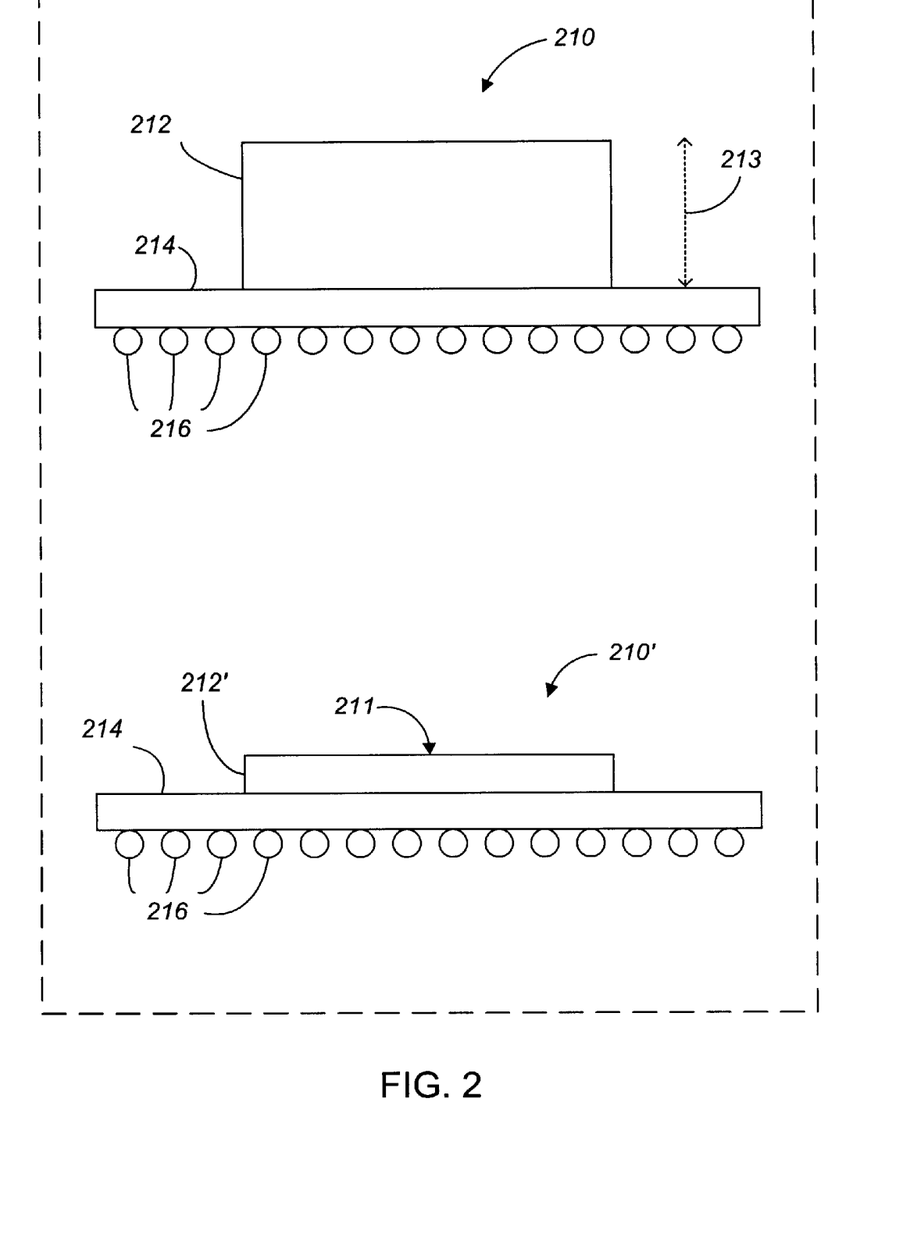
FIG. 2 is a schematic diagram showing thinning of a flip-chip IC (prior art).
Figure 3:
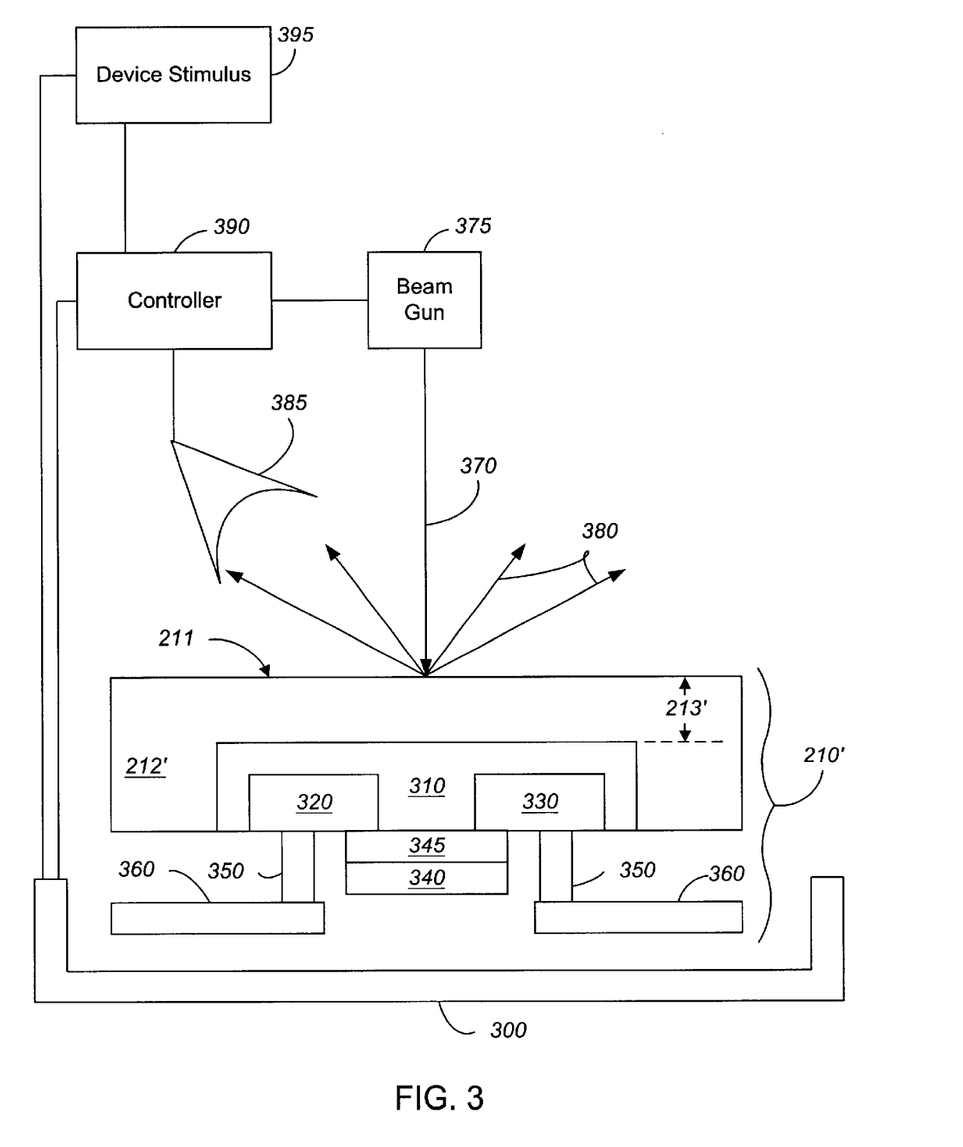
FIG. 3 is a schematic diagram showing a thinned flip-chip IC in an electron beam diagnostic system, according to an implementation of the invention.

FIG. 2 is a schematic diagram that illustrates thinning a flip-chip IC 210 for a measurement. The flip-chip IC 210 has a silicon substrate 212, whose thickness 213 is typically between 300 and 700 $\mu$m (micrometers). The substrate 212 is laid over the package plate 214, which faces the circuit elements on the substrate 212, and electrically connects them to the solder balls 216. The solder balls 216 are the external connections through which external voltage can be applied to the flip-chip IC 210. The flip-chip IC 210 is globally thinned to obtain a thinned flip-chip IC 210' with a polished outer surface 211. The thinned substrate 212' has a remaining thickness 213' (FIG. 3) of about 1 to 3 $\mu$m from the deepest wells. This thickness can be achieved without damaging the circuit elements, e.g., by using a mechanical technique described in commonly-owned U.S. patent application Ser. No. 09/924,736, for Method for Global Die Thinning and Polishing of Flip-Chip Packaged Integrated Circuits, filed Aug. 7, 2001, the entire disclosure of which is hereby incorporated by reference. Other thinning techniques can be applied as well, such as global substrate removal by wet or dry chemical etching (described, for example, in U.S. Pat. No. 6,093,331), or by local substrate removal by laser chemical etching, by femtosecond laser ablation, by focused ion beam, by milling, or by RIE (reactive ion etching). Furthermore, different substrate materials can require different remaining thickness 213', depending on the resulting electromagnetic coupling between the outer surface 211 and certain circuit elements, as described below.

FIG. 3 is a schematic diagram that shows the thinned flip-chip IC 210' (in this example, a pFET) placed in a sample holder 300 of a charged particle beam diagnostic system. The thinned flip-chip IC 210' has an N-well 310 holding a diffusion source 320 and a diffusion drain 330 connected by a gate 340 having a gate oxide 345. A voltage can be applied to the diffusion source 320 or drain 330 through a contact 350 and metal lines 360. While the voltage is applied, a particle beam gun 375 focuses a charged particle beam 370—typically an electron beam—on a spot on the outer surface 211 of the thinned substrate 212'. The electron beam 370 generates secondary electrons 380 that are detected by a photomultiplier 385. The photomultiplier 385 provides a detected intensity that depends on the electrical potential at the spot of the outer surface 211 where the charged particle beam 370 reaches the thinned substrate 212'. This electrical potential can be influenced by circuit elements, such as the N-well 310, the diffusion source 320, or the diffusion drain 330: when these circuit elements receive voltage stimuli, an electromagnetic coupling rearranges the electric charges on and around these circuit elements. The voltage stimuli can be provided by device stimulus electronics 395, which can be a circuit tester or signal driver, for example. In particular, this electromagnetic coupling provides a capacitive coupling to the outer surface 211 and changes the electrical potential there. For example, when a positive voltage is applied to the N-well 310, the electrical potential changes on the part of the outer surface 211 that faces the N-well 310; this electrical potential change decreases the number of secondary electrons 380, and, as a result, in voltage contrast imaging, the photomultiplier 385 detects a decreasing intensity. The detected intensity is transferred to a controller 390 that also controls the particle beam gun 375 and the sample holder 300. (Note that for waveform probing there is an energy measurement before the signal goes to the photomultiplier tube. For example, the controller of an e-beam prober will vary the energy filter pass condition so that there is no change in signal, i.e., particles. This is done so that noise does not depend on the signal. See, for example, U.S. Pat. No. 4,706,019.)

Figure 4:
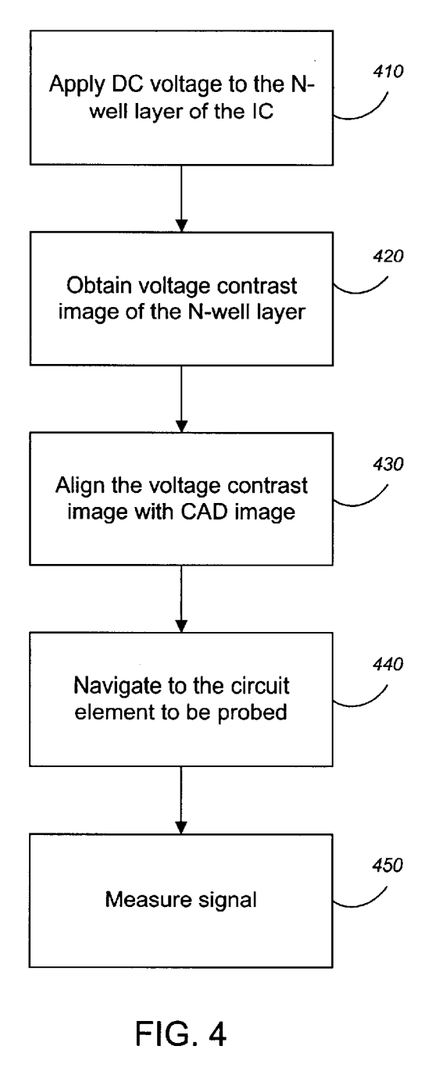
FIG. 4 is a flowchart of a method for locating a circuit element of a flip-chip IC with an electron beam diagnostic system in an implementation of the invention.

FIG. 4 is a flowchart that shows an implementation of step 130: this implementation identifies a circuit element to be probed with the help of a voltage contrast image of an N-well layer of a thinned flip-chip. A positive DC voltage is applied to the N-well layer (step 410). The positive DC voltage can optionally be provided as part of a general voltage signal that generates electrical potential changes on the outer surface 211. A voltage contrast image is made by measuring these changes (step 420) across a viewing area. This image is then used for navigation to find structures in the IC. For example, the outer surface 211 can be scanned, e.g., raster scanned, by causing the charged particle beam 370 to translate across the substrate. This scan can be controlled by the controller 390, which can change either the aim of the beam gun 375, or the position of the sample holder 300. As the beam moves across the substrate, the detector 385 measures the generated secondary electrons 380 and sends the detected intensity to the controller 390. The voltage contrast image is formed by assigning the detected intensities to image pixels. As explained above, at surface features corresponding to the N-well layer, in creating a voltage contrast image, the fewer secondary electrons 380 cause lower detected intensities. If the e-beam is being used to measure a changing voltage in a device, the intensity of the secondary electron collection is maximized by adjusting the energy filter of the e-beam prober.

Figure 5:
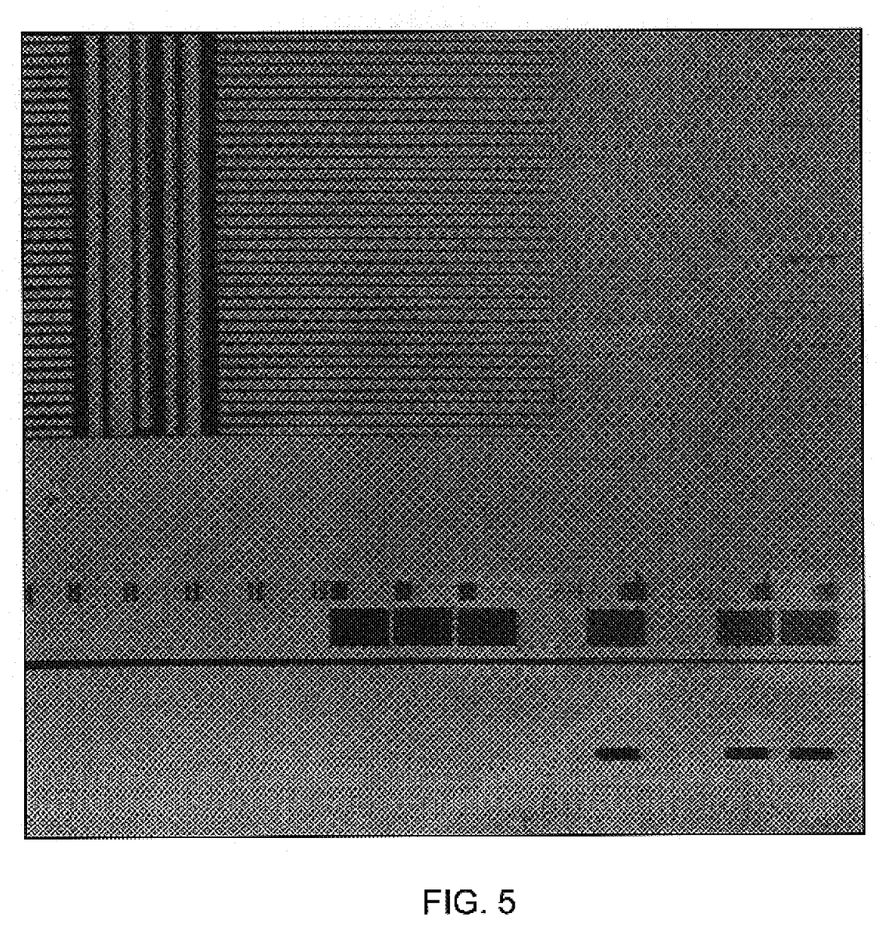
FIG. 5 shows a voltage contrast image with a voltage applied to the N-well layer of a thinned flip-chip IC.
Figure 6:
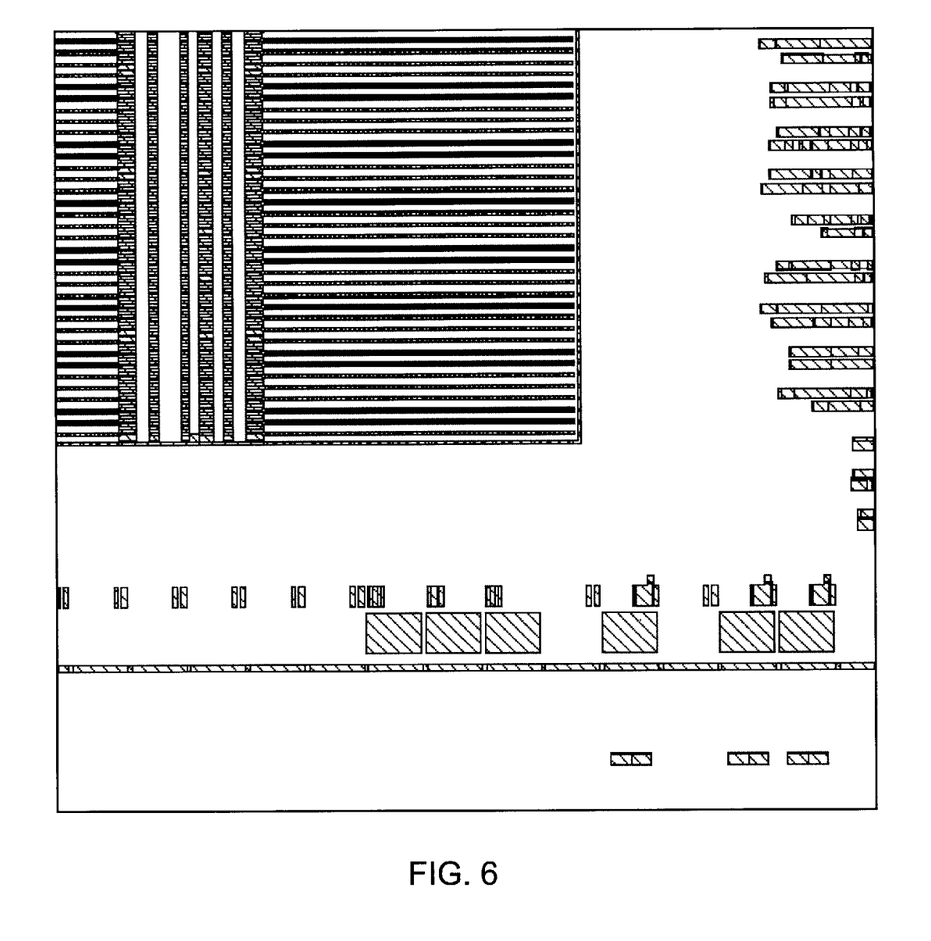
FIG. 6 shows a computer aided design layout image corresponding to FIG. 5.

FIG. 5 shows a resulting voltage contrast image—with a 3.3V DC voltage applied to the N-well layer, which appears as a dark area representing lower intensity of secondary electrons. Generally, applying the DC voltage can be done by applying normal voltage to the IC's power pins or contacts. The voltage contrast image is aligned (step 430) to a corresponding CAD layout image. The CAD layout image corresponding to FIG. 5 is shown in FIG. 6. The CAD image is used to navigate to the circuit element to be probed (step 440). A signal corresponding to the element can then be measured (step 450).

The contrast shown in a voltage contrast image of a circuit element depends on the voltage applied to the circuit element. For example, in an image of an N-well layer of a thinned flip-chip silicon-based IC, the voltage contrast image depends on a number of factors including the coupling strength of the electromagnetic coupling that couples the N-well layer to the outer surface. This coupling strength varies with the remaining thickness of the thinned substrate and with the DC voltage applied to the N-well layer. The coupling strength increases with the DC voltage and as a result the N-well layer will appear increasingly darker than the silicon substrate as the DC voltage increases. Similarly, decreasing the remaining thickness increases the voltage contrast.

Figure 7A:
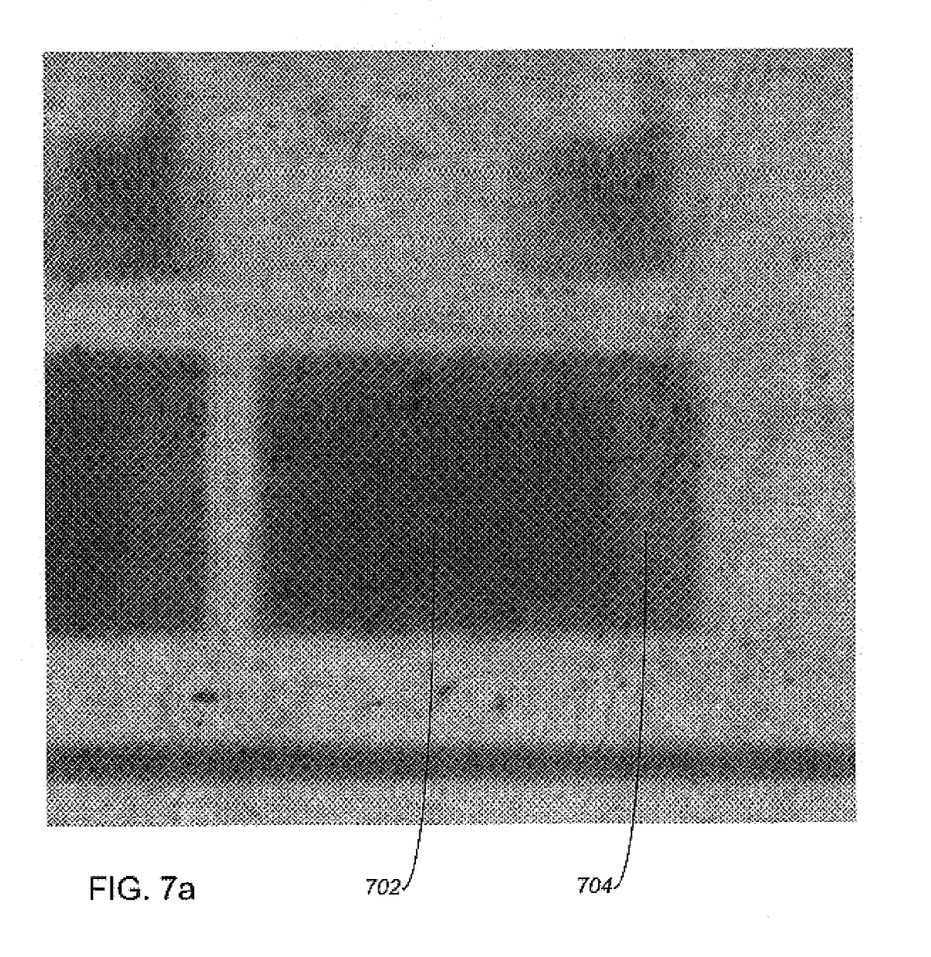
FIG. 7a shows a circuit element probed from the silicon side of a thinned flip-chip IC and FIG. 7b shows a corresponding CAD layout image.
Figure 7B:
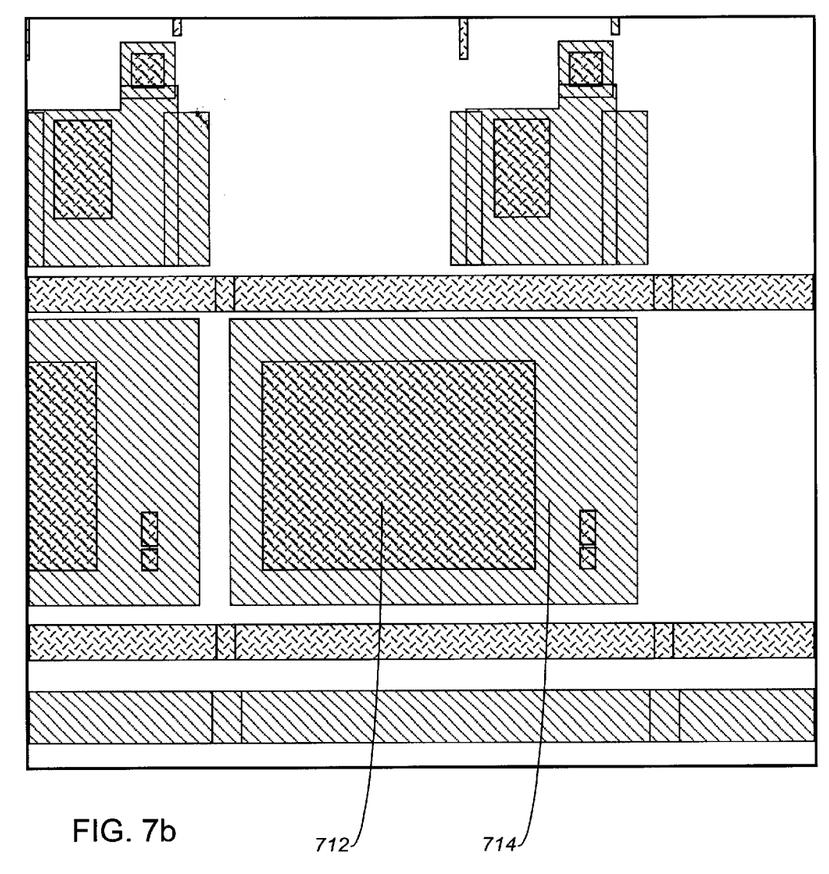
Figure 8:
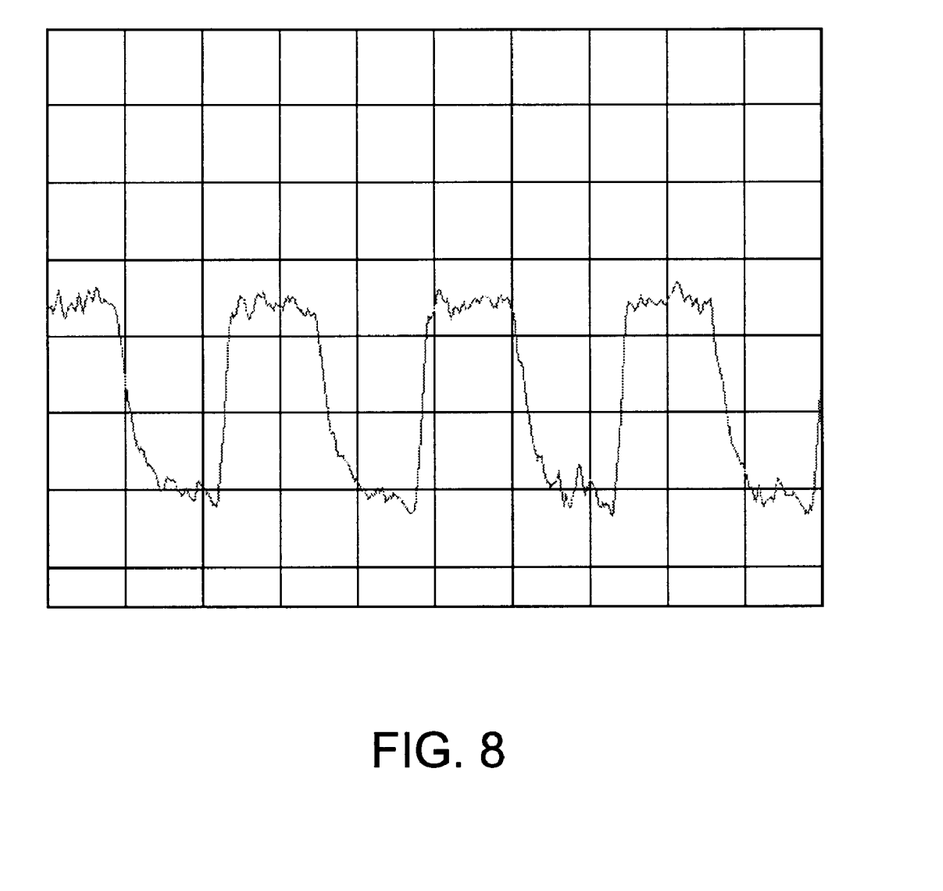
FIG. 8 shows results of an electron beam measurement from the silicon side of a thinned flip-chip IC.

FIGS. 7a, 7b, and 8 show how one can take advantage of the voltage dependence of the voltage contrast image, and implement steps 140 and 150 (FIG. 1). FIG. 7a shows a circuit element that has a P-diffusion layer 702 in an N-well 704, similar to the diffusion source 320 and drain 330 in FIG. 3. This P-diffusion layer is identified on the voltage contrast image through alignment with a corresponding CAD layout image (FIG. 7b), which shows the corresponding P-diffusion layer and N-well drawn as areas 712 and 714, respectively. The P-diffusion layer appears darker than the N-well layer on the voltage contrast image (FIG. 7a) because of a voltage difference between these two layers. This voltage difference resulted from a time dependent, i.e., AC, voltage applied to the P-diffusion layer, in accordance with an implementation of step 140. Consequently, the darkness, or intensity, on the voltage contrast image depends on time; this time dependence of the intensity can be measured, e.g., by the controller 390 of an electron beam diagnostic system in an implementation of step 150.

FIG. 8 shows the result of an N-well intensity measurement waveform where a periodic step-like voltage (square wave, in this example, 3.3V, 7.81 MHz) is applied to a circuit element of a thinned flip-chip IC. In FIG. 8, the vertical scale is 500 mV per division; the horizontal scale, 50 ns (nanoseconds) per division. As shown in FIG. 8, the measured intensity has the same periodicity, but does not have the same step-like shape, as the applied voltage. This shape change is characteristic to the electromagnetic coupling between the circuit element the voltage is applied to and the spot of the outer surface that is measured with the charged particle beam. In FIG. 8, the shape change may be explained by the capacitive or the resistive nature of the electromagnetic coupling. In any case this degradation in the measurement is due to thickness and does decrease as the silicon is further thinned.

In some circumstances, heat dissipation techniques should be applied. For example, a heat dissipation element can be placed on the outer surface 211 to augment the heat dissipation ability of the silicon substrate 210'. The heat dissipation element can be a diamond heat spreader similar to the one described, for example, in Eiles, T., et al., Transparent Heat Spreader for Backside Optical Analysis of High Power Microprocessors, International Symposium for Testing and Failure Analysis (2000). Because an electron beam cannot penetrate the diamond, the heat spreader is modified, e.g., by placing a through-hole above the area of interest on the outer surface 211. Furthermore, the diamond heat spreader can be mechanically adjustable relative to the thinned substrate 210' to provide adequate heat dissipation and, by allowing the hole in the diamond to track the area being analyzed, to allow the electron beam to scan an area of the outer surface 211 that is larger than the hole.

A number of implementations of the invention have been described. Nevertheless, it will be understood that various modifications may be made without departing from the spirit and scope of the invention. For example, in some applications a focused beam of gallium ions can be used instead of an electron beam. The invention can be implemented for application to kinds of devices other than those specifically mentioned, including bipolar devices. The invention can be implemented for application to kinds of substrates other than those specifically mentioned, including gallium arsenide substrates and N-type silicon substrates. Accordingly, other implementations are within the scope of the following claims.

What is claimed is:

1. A method, comprising:
    applying a voltage to a circuit element of an integrated circuit having a thinned substrate layer, the circuit element being beneath an outer surface of the thinned substrate layer, the applied voltage inducing an electrical potential on the outer surface; and
    detecting the electrical potential as a surface feature on the outer surface.

2. The method of claim 1, wherein the substrate is a silicon substrate, the method further comprising:
    creating the thinned substrate layer by thinning the substrate to about 1 to 3 micrometers from the deepest wells.

3. The method of claim 2, wherein creating the thinned substrate layer further comprises:

polishing the outer surface of the substrate.

4. The method of claim 1, wherein detecting the electrical potential comprises:

applying a charged particle beam to the outer surface and measuring secondary particles generated by the charged particle beam.

5. The method of claim 4, wherein the charged particle beam is an electron beam.

6. The method of claim 4, wherein the charged particle beam is a focused ion beam.

7. The method of claim 1, further comprising:

obtaining a surface voltage contrast image by detecting the electrical potential of a plurality of features on the outer surface due to buried circuit elements.

8. The method of claim 7, further comprising:

using the voltage contrast image for locating a circuit element in the integrated circuit.

9. The method of claim 8, further comprising:

aligning the voltage contrast image with a CAD layout image.

10. The method of claim 1, wherein the circuit element is an N-well layer of the integrated circuit.

11. The method of claim 10, wherein the circuit element is a P diffusion within an N well.

12. The method of claim 1, wherein the circuit element is a P-well layer of the integrated circuit.

13. The method of claim 12, wherein the circuit element is an N diffusion within a P well.

14. The method of claim 1, wherein the circuit element is a diffusion region of the integrated circuit.

15. The method of claim 1, wherein the applied voltage includes a time dependent component.

16. The method of claim 1, wherein the applied voltage includes a time independent component.

17. The method of claim 1, further comprising placing a heat dissipation element on the outer surface.

18. A method for determining the location of a circuit element in an integrated circuit, comprising:

applying a voltage to a circuit element of an integrated circuit having a thinned substrate layer, the circuit element being beneath an outer surface of the thinned substrate layer, the applied voltage inducing an electrical potential on the outer surface;

obtaining a voltage contrast image by detecting electrical potentials over a region of the outer surface; and using the voltage contrast image to determine the location of the circuit element.

19. The method of claim 18, further comprising:

aligning the voltage contrast image with a CAD layout image.

20. The method of claim 18, wherein detecting the electrical potential includes applying a charged particle beam on the outer surface and measuring secondary particles generated by the charged particle beam.

21. The method of claim 20, wherein the charged particle beam is an electron beam.

22. The method of claim 18, wherein the circuit element is an N-well layer.

23. The method of claim 18, wherein the applied voltage is a DC voltage.

24. A method, comprising:

determining the location of a circuit element in an integrated circuit by applying a voltage to the circuit element, the circuit element being disposed on a thinned substrate and located beneath an outer surface of the thinned substrate, the applied voltage inducing an electrical potential on the outer surface, and using an electron beam prober to detect the electrical potential as a surface feature on the outer surface; and inducing a current in the circuit element through the thinned substrate with an electron beam from the electron beam prober.

25. The method of claim 24, further comprising:

detecting the induced current to perform failure analysis.

* * * * *